US011211116B2

(12) United States Patent
Yang et al.

(10) Patent No.: US 11,211,116 B2
(45) Date of Patent: Dec. 28, 2021

(54) EMBEDDED SRAM WRITE ASSIST CIRCUIT

(71) Applicant: Taiwan Semiconductor Manufacturing Co., Ltd., Hsin-Chu (TW)

(72) Inventors: Chih-Chuan Yang, Hsinchu (TW); Kian-Long Lim, Hsinchu County (TW); Feng-Ming Chang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/922,270

(22) Filed: Jul. 7, 2020

(65) Prior Publication Data

US 2021/0098058 A1    Apr. 1, 2021

Related U.S. Application Data

(60) Provisional application No. 62/907,393, filed on Sep. 27, 2019.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
USPC ........................................................ 365/156
See application file for complete search history.

(56) References Cited

U.S. PATENT DOCUMENTS

| 5,143,866 | A  | 9/1992  | Matsutani   |
| 8,310,860 | B1 | 11/2012 | Houston     |
| 8,772,109 | B2 | 7/2014  | Colinge     |
| 8,785,285 | B2 | 7/2014  | Tsai et al. |
| 8,816,444 | B2 | 8/2014  | Wann et al. |
| 8,823,065 | B2 | 9/2014  | Wang et al. |
| 8,860,148 | B2 | 10/2014 | Hu et al.   |

(Continued)

FOREIGN PATENT DOCUMENTS

EP        0023429 B1    12/1985

OTHER PUBLICATIONS

Su, Hsin-Wen, et al., "Cut Metal Gate in Memory Macro Edge and Middle Strap", U.S. Appl. No. 16/441,217, filed Jun. 14, 2019, Assignee: Taiwan Semiconductor Manufacturing Co., Ltd., 36 pages.

*Primary Examiner* — Sung Il Cho
(74) *Attorney, Agent, or Firm* — Haynes and Boone, LLP

(57) ABSTRACT

A static random-access memory (SRAM) semiconductor device including a memory unit is provided. The memory unit includes a bit array arranged in rows and columns. The columns are defined by a plurality of bit line pairs connecting to a plurality of memory cells in the column. The memory unit also includes an edge area adjacent an edge row of the bit array, wherein the edge row includes a plurality of dummy memory cells. The memory unit further includes a plurality of bit line drivers adjacent the bit array and opposite the edge area. The bit line drivers are for driving the bit lines with data to the memory cells during a write operation. The dummy memory cells include a write assist circuit for each bit line pair. The write assist circuit is used for facilitating the writing of the data on the bit line pairs to the memory cells.

20 Claims, 6 Drawing Sheets

(56) References Cited

U.S. PATENT DOCUMENTS

| | | | |
|---|---|---|---|
| 8,980,763 B2 | 3/2015 | Wang et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,455,028 B1* | 9/2016 | Sahu | G11C 11/419 |
| 9,520,482 B1 | 12/2016 | Chang et al. | |
| 9,576,814 B2 | 2/2017 | Wu et al. | |
| 9,625,824 B2 | 4/2017 | Lu et al. | |
| 9,627,379 B1 | 4/2017 | Chang et al. | |
| 9,721,650 B1* | 8/2017 | Raj | G11C 5/025 |
| 10,050,045 B1 | 8/2018 | Hsu et al. | |
| 10,314,154 B1 | 6/2019 | Hsu et al. | |
| 10,734,067 B1* | 8/2020 | Akamatsu | G11C 11/412 |
| 2006/0262628 A1* | 11/2006 | Nii | G11C 11/412 365/226 |
| 2007/0159909 A1* | 7/2007 | Frederick | G11C 5/14 365/228 |
| 2008/0116400 A1 | 5/2008 | Schmidt et al. | |
| 2009/0207650 A1* | 8/2009 | Braceras | G11C 11/417 365/156 |
| 2010/0061176 A1* | 3/2010 | Kim | G11C 11/417 365/226 |
| 2013/0063803 A1 | 3/2013 | Delgado et al. | |
| 2013/0077387 A1* | 3/2013 | Yabuuchi | G11C 11/419 365/154 |
| 2014/0233330 A1* | 8/2014 | Ko | G11C 11/419 365/189.16 |
| 2015/0092476 A1* | 4/2015 | Lin | G11C 7/1075 365/154 |
| 2015/0131364 A1* | 5/2015 | Hsieh | G11C 11/419 365/154 |
| 2017/0110183 A1* | 4/2017 | Chung | G06F 3/0653 |
| 2017/0110454 A1 | 4/2017 | Chang et al. | |
| 2017/0125411 A1 | 5/2017 | Yu et al. | |
| 2018/0113821 A1 | 4/2018 | Narasimhan | G06F 13/1689 |
| 2018/0294018 A1* | 10/2018 | Baeck | G11C 11/4096 |
| 2019/0066773 A1* | 2/2019 | Park | G11C 11/419 |
| 2019/0067277 A1 | 2/2019 | Tsai et al. | |
| 2019/0103472 A1 | 4/2019 | Cheng et al. | |

* cited by examiner

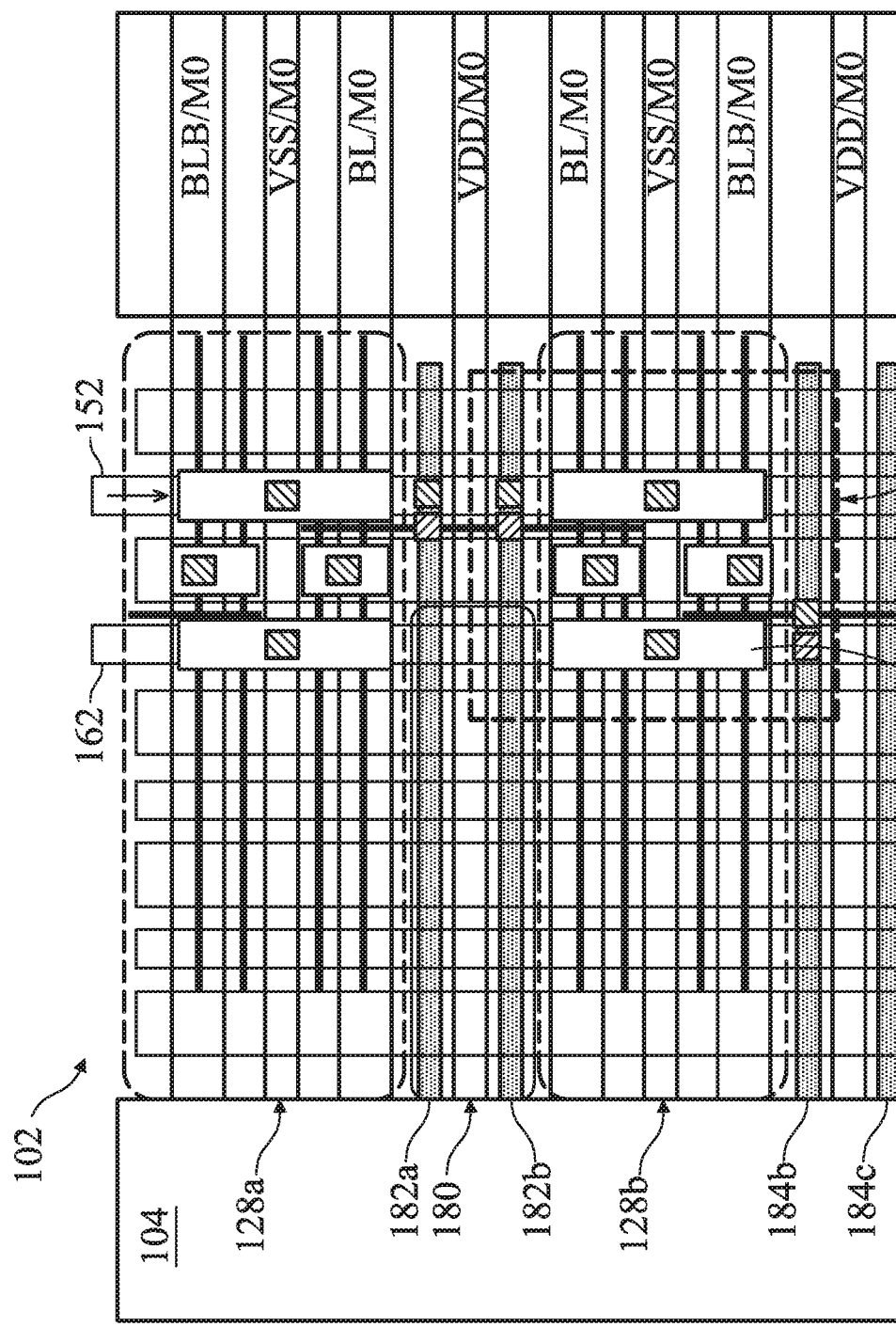

EMBEDDED SRAM WRITE ASSIST CIRCUIT

This patent claims the benefit of U.S. Ser. No. 62/907,393 filed on Sep. 27, 2019, the contents of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Static random access memory (SRAM) generally refers to any memory or storage that can retain stored data only when power is applied. To conserve power and improve energy efficiency, as well as to reduce leakage current in the OFF state, it is generally helpful to reduce the supply voltage. However, the reduction in supply voltage is limited by a minimum threshold voltage, Vcc-min. When operated at a supply voltage near or below Vcc-min, the SRAM chips may suffer increased fault rate or even failures. For example, the speed of write operations depends on the speed of discharging, which in turn depends on the voltage applied. When the supply voltage is near or below Vcc-min, such discharging becomes inefficient and suffer low speed and/or low stability. Such challenges are aggravated for bit cells at the periphery of the SRAM chip remote from the power source. This is because the voltage applied on these cells are further reduced due to the resistance of bit lines. As the process continue to scale down, the resistance of bit line increases further aggregating the problem.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4a and 4b show a layout view of portions of two dummy memory cells and well pickup areas of the memory unit in FIG. 1, in accordance with an embodiment.

DETAILED DESCRIPTION

Figure 1:
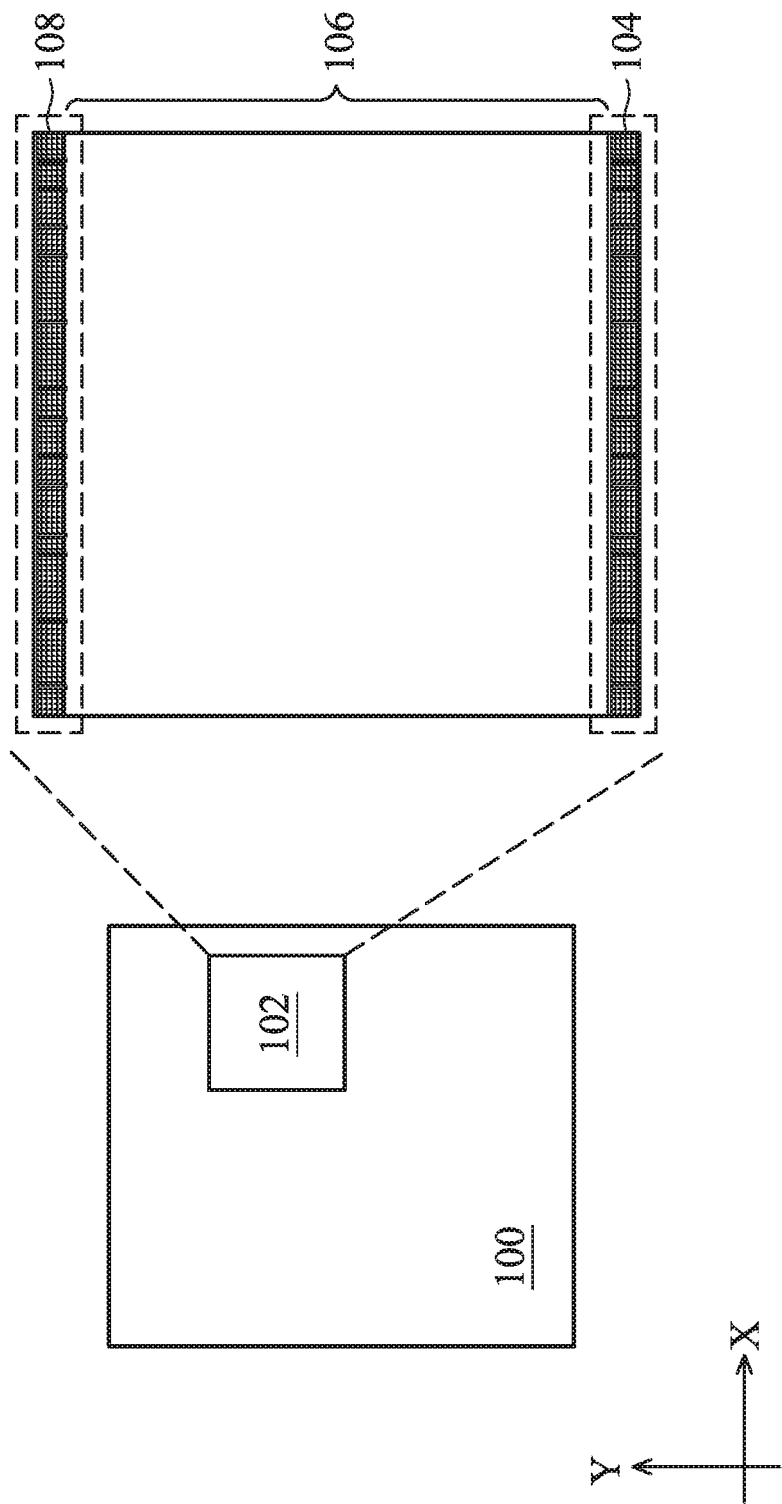
FIG. 1 is a simplified block diagram of an integrated circuit (IC) with an embedded memory, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and circuit design, and more particularly to memory arrays such as a static random-access memory (SRAM).

FIG. 1 shows a semiconductor device 100 with a memory unit 102. The semiconductor device can be, e.g., a microprocessor, an application specific integrated circuit (ASIC), a field programmable gate array (FPGA), or a digital signal processor (DSP). The memory unit 102 may be a single-port static random-access memory (SRAM), a dual-port SRAM macro, or other type of memory. In the present embodiment, the memory unit 102 is an embedded SRAM for the semiconductor device 100. It is understood that other array-type devices, such as a standalone SRAM device, can also benefit from one or more embodiments of the present invention.

The memory unit 102 includes one or more blocks of memory bits for storage. The semiconductor device 100 also includes peripheral logic circuits adjacent to the memory unit 102 for implementing various functions such as address decoding, word/bit selector, data drivers, memory self-testing, etc. Each of the memory bits and the logic circuits may be implemented with various p-type metal oxide semiconductor (PMOS) and n-type metal oxide semiconductor (NMOS) transistors such as planar transistors, FinFET, magnetic random access memory (MRAM), gate-all-around (GAA) nanosheet transistors, GAA nanowire transistors, or other types of transistors. Further, the memory unit 102 and the logic circuits may include various contact features (or contacts), vias, and metal lines for connecting the source, drain, and gate electrodes (or terminals) of the transistors to form an integrated circuit.

Still referring to FIG. 1, for the sake of example, the memory unit 102 is illustrated as a single block of memory, it being understood that there can be many more blocks, as desired. The memory unit 102 includes an edge area 104. In the present embodiment, the edge area 104 is located at an edge of the memory unit and is oriented lengthwise along the direction X. In the present embodiment, the edge area 104 does not contain memory bits and is used for implementing various peripheral circuitry, including well pick-up (WPU) area. The WPU area provides well pick-up structures for supplying voltages (or biasing) to the N wells and P wells in the memory unit 102. The memory unit 102 further includes a memory bit array 106 adjacent the edge are 104. The memory bit array 106 contain the memory bits of the memory unit 102. The memory unit 102 further includes an area for bit line drivers 108. The bit line driver area provides drivers for bit lines (BL) and complementary bit lines (bit line bar, or BLB), a pair of each for each of the memory bits in the memory unit 102. In the present embodiment, the bit line drivers 108 are positioned opposite from the edge area 104, with respect to the memory bit array 106.

Figure 2:
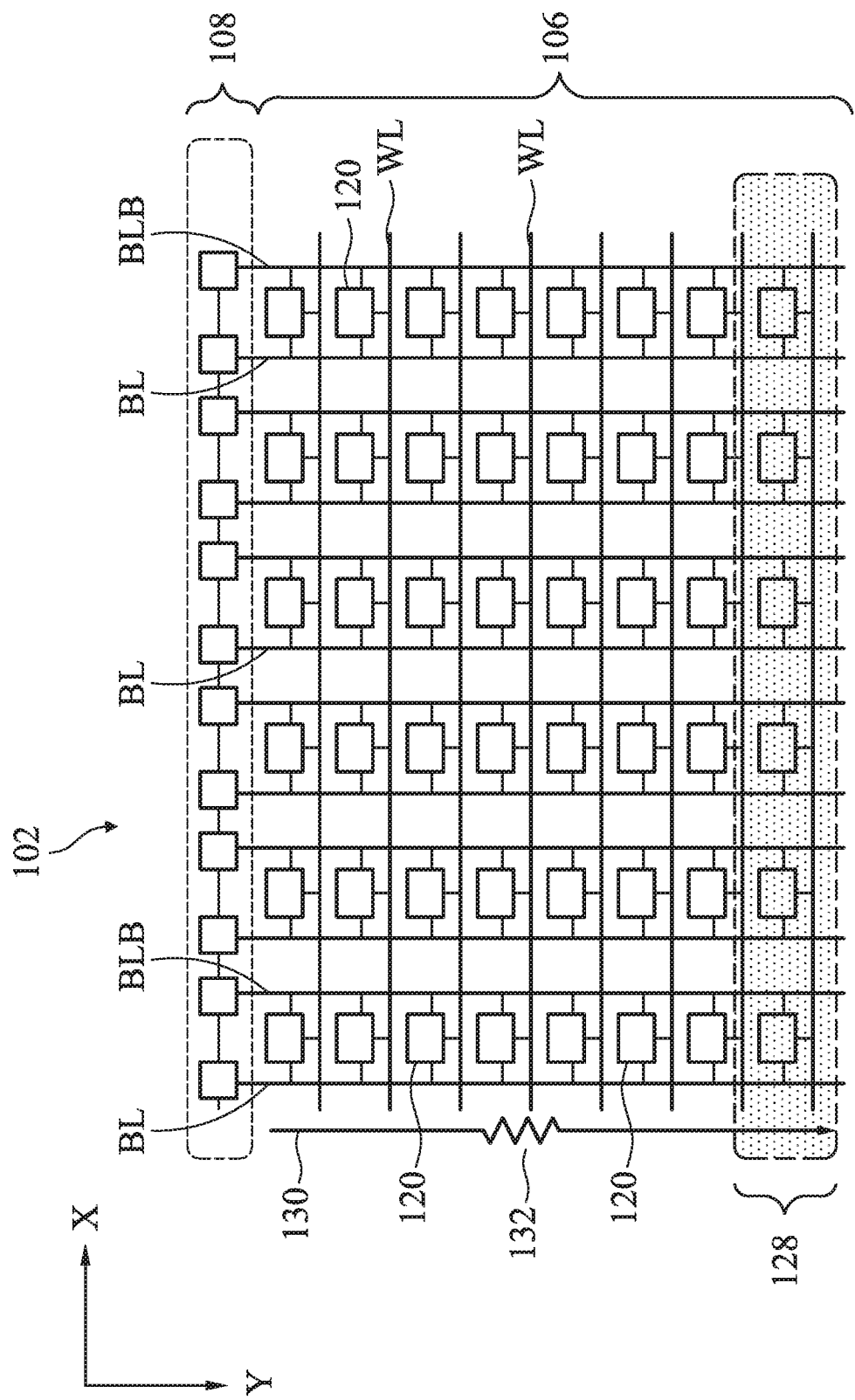
FIG. 2 shows a top view of a portion of the memory unit in FIG. 1, in accordance with an embodiment.

Referring to FIG. 2, for a simplified example, the memory bit array 106 includes 48 memory cells 120, arranged in rows and columns, according to the x-y axis shown in the figure. Continuing with the present example, each memory cell is a six-transistor (6T) memory cell that connect to a word line WL and a pair of bit lines BL and BLB. Each bit line pair BL, BLB is also connected to a corresponding pair of bit line drivers 108. The word lines WL are selected by a decoded row address, such that a single row is selected at any one time for a read or write operation.

A memory block can include one or more dummy rows of memory cells, and in the present embodiment, a dummy row 128 is provided on the edge of the memory bit array 106 adjacent to the edge area 104 (FIG. 1), and opposite to the bit line drivers 108. Further in the present embodiment, the dummy row 128 of memory cells is one-row thick, i.e., it is a single row of dummy memory cells. In other embodiments, the dummy row 128 may have multiple rows of dummy memory cells.

There are reasons for providing a dummy row of memory cells. For example, there is often a difference in the active/isolation regions of the memory cell area, as compared to peripheral areas to the memory bit array 106. As such, the row of memory cells adjacent to the peripheral areas such as the edge area 104 are often unused (dummy).

For a memory write operation, the bit line drivers 108 drive their corresponding bit lines BL, BLB with data to be stored in a memory cell 120 of a specific row selected by a corresponding word line WL. An arrow 130 is provided to illustrate the transmission line effects of the bit lines BL, BLB. As technology progresses, the line widths and thickness for the bit lines BL, BLB becomes increasing smaller. Likewise, the number of rows of memory cells, and hence the length of the bit lines BL, BLB, becomes increasingly longer. The arrow 130 is illustrated to include a resistance 132, which further represents the transmission line effects of the bit lines. That is, as each bit line BL, BLB extends away from its corresponding driver, there is a corresponding current-voltage (IR) drop along the line.

Figure 3:
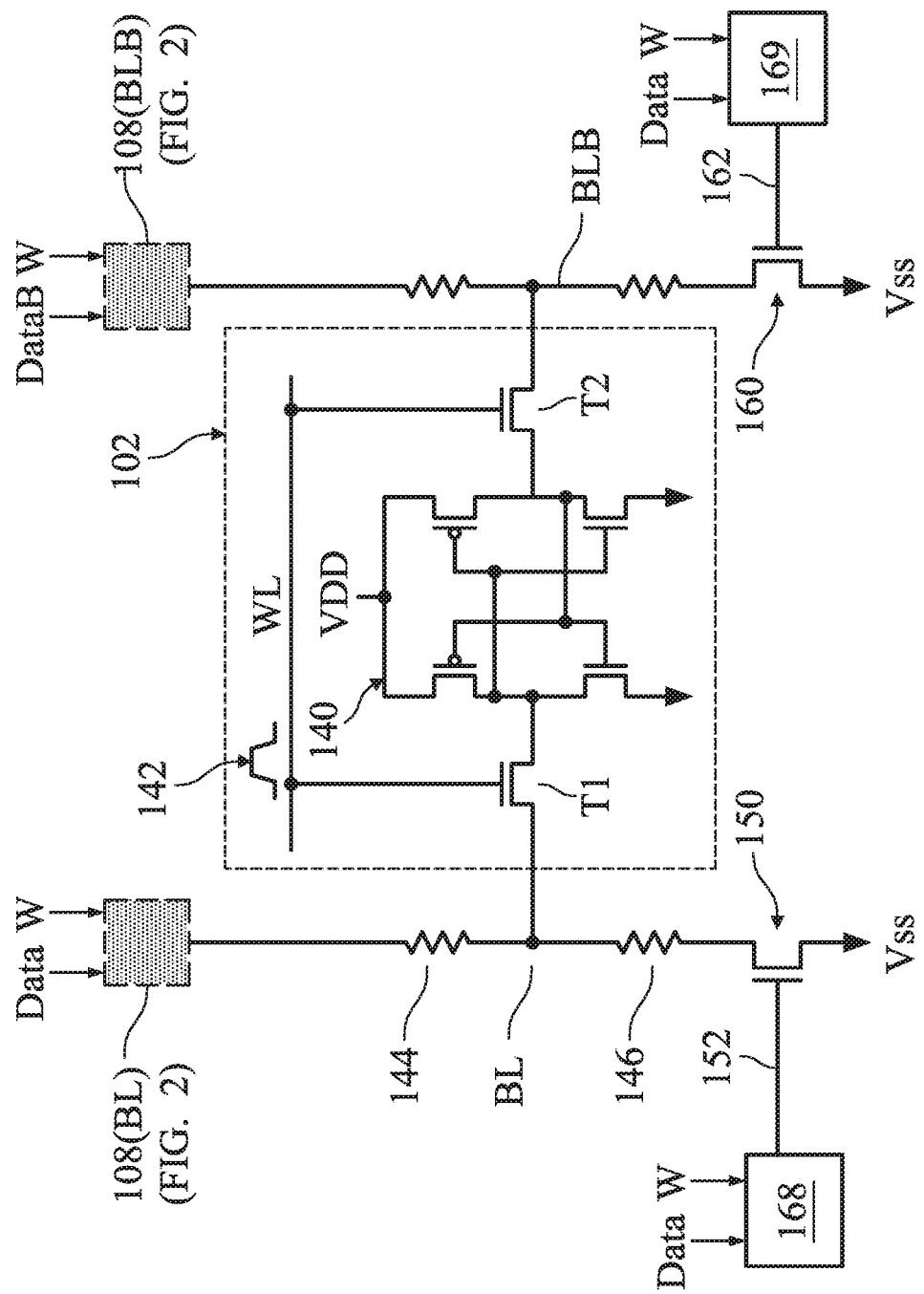
FIG. 3 shows a circuit diagram of a memory cell of the memory unit of FIG. 1, in accordance with an embodiment.

Referring to FIG. 3, in the present embodiment, the memory cell 120 is a six transistor (6T) SRAM. The 6T SRAM memory cell includes a flip-flop 140 positioned between two pass transistors T1, T2. The gates of the pass transistors T1, T2 are commonly tied to the corresponding word line WL, so that a signal 142 on the word line WL activates the pass transistors for data to flow out of or into the flip-flop 140 for read or write operations. The source/drain of the pass transistor T1 is connected between the bit line BL and the flip-flop 140, and the source/drain of the pass transistor T2 is connected between the bit line BLB.

While only a single row of memory cells may be activated at any one time, the transmission line effects of the bit lines are adversely affected such that the rows of memory cells relatively far from the bit line drivers 108 (FIG. 2) receive a modified signal, as compared to the rows of memory cells relatively close to the bit line drivers. This is illustrated, again, by the resistors 144, 146 drawn on the bit lines. It is understood that the shown resistors are representative of the transmission line effects that are inherent to the bit lines.

As discussed in greater detail below, in the present embodiment, a write assist device 150 is provided on the bit line BL, at the opposite end from the bit line driver 108(BL). Likewise, a write assist device 160 is provided on the bit line BLB, at the opposite end from the bit line driver 108(BLB). In one embodiment, the write assist devices 150, 160 are transistors connected in-line between the corresponding bit line and ground, and with each gate connected to a write assist signal 152, 162, respectively. Also in the present embodiment, the write assist signals 152 and 162 are separately controlled. In another embodiment, the write assist signals 152, 162 are the same, and are provided to both devices 150, 160. In this embodiment, the two write assist devices 150, 160 may have transistors with opposite polarities.

The write assist signals 152, 162 are driven by write assist signal drivers 168, 169, which can be located in the edge area 104. The circuitry can be based on the write data (Data, DataB) being provided to the corresponding bit line driver 108, as well as a write signal W that indicates a write operation is to be performed. That is, if a "0" is to be written on the bit line BL, then the write signal 152 will be asserted, and not the write assist signal 162. Likewise, if a "1" is to be written on the bit line BL, then the write assist signal 162 will be asserted, and not the write assist signal 152. Such a driver can be made of one or more logic gates that are a function of the data to be written, a write enable signal, and other timing signals, as would be known in the art.

The write assist devices 150, 160 are placed in the memory cells of the dummy row 128 (FIG. 2). That is, the memory cells in the dummy row 128 that are otherwise unused, can be modified to provide the write assist driver/signal functionality with minimal modification and with no, or substantially little, increase in size. The modifications to the memory cell in the dummy row are described below, with reference to FIGS. 4a and 4b.

In operation, when it is desired to write a "0" (or ground, or low) voltage to the memory cell 120, a "0" is driven by the bit line driver 108(BL) onto the bit line BL. In addition, the write assist signal 152 is asserted, which also drives a "0" onto the bit line BL from the write assist device 150. Simultaneously, a "1" (or Vccmin, or high) voltage is driven by another bit line driver 108(BLB) onto the bit line BLB. During this operation, the signal 142 is provided on the word line WL such that the data from the bit line drivers passes through the respective pass transistors T1, T2 and are stored in the flip-flop 140.

It is understood that in the present embodiment, there is only a write assist device/signal for writing a "0" on a corresponding bit line, and there is not a write assist device/signal for writing a "1" on a bit line. In another embodiment, the write assist device/signal can be used for writing a "1" on the corresponding bit line. In yet another embodiment, two write assist drivers/signals can be used for each bit line, for writing a "0" or a "1", as desired.

Figure 4B:
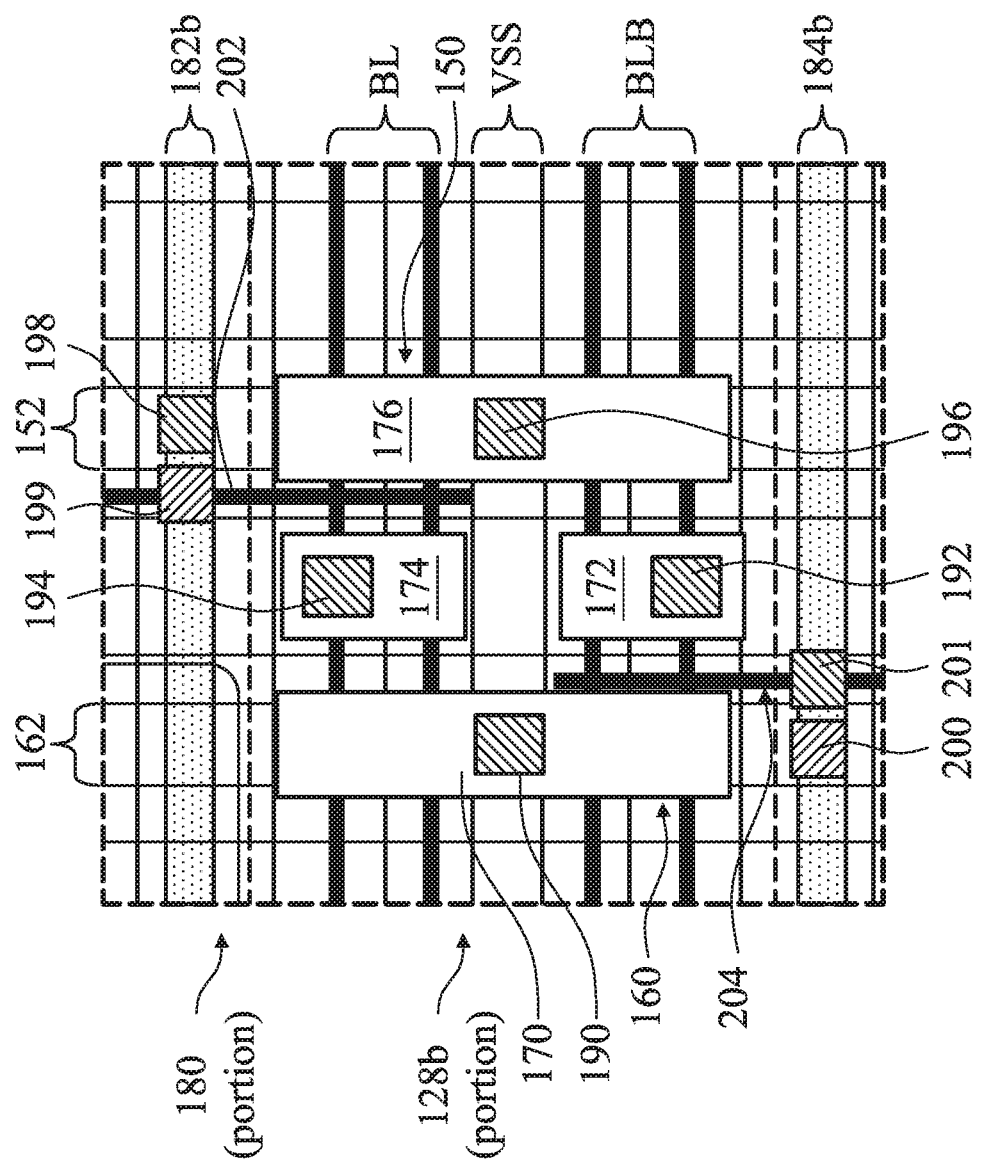

Referring now to FIGS. 4a, 4b, a portion of a memory unit 102 is illustrated. It is noted that the memory unit 102 is rotated ninety degrees from the illustration in FIGS. 1 and 2, The memory unit 102 includes a plurality of bit cells in the memory bit array 106, with circuitry as described above with reference to FIG. 3. This circuitry includes multiple lines running horizontally in a metal layer (e.g., M0), including a bit line pair BL, BLB, and a pair of power supplies Vss, VDD. As shown in the figure, these multiple lines connect multiple memory cells 120, including the dummy cells.

The dummy row 128 of memory cells includes multiple lines running vertically in an upper metal layer (e.g., M1), including the two write assist signals 152, 162. As shown in FIG. 4a, these write assist signals connect multiple dummy cells in the dummy row 128. For the sake of reference in FIG. 4a, two of the dummy cells are identified as dummy cells 128a and 128b.

For each dummy cell in the dummy row 128, there are (at least) two source/drain regions 170, 176 that are electrically connected to the Vss (M0). The source/drain region 170 is connected to Vss (M0) through a M0-to-substrate contact 190; and the source/drain region 176 is connected to Vss (M0) through a M0-to-substrate contact 196. Each dummy cell in the dummy row 128 also includes (at least) one source/drain region 172 that is electrically connected to bit line BLB (M0), and a source/drain region 174 that is electrically connected to bit line BL (M0). The source/drain region 172 is connected to bit line BLB (M0) through a M0-to-substrate contact 192; and the source/drain region 174 is connected to bit line BL (M0) through a M0-to-substrate contact 194.

In the present embodiment, well pickup areas (WPUs) 180 are included in the edge area 104 between adjacent dummy cells in the dummy row 128. In this embodiment, the WPUs 180 are n-well pickup areas, although p-well pickup areas can alternatively be used. Two dummy lines 182, 184 are provided for each dummy cell, running horizontally in the figures. In the present example, the dummy lines 182, 184 are also laid out across the WPUs 180. Dummy lines 182b, 184b are associated with dummy cell 128b. Dummy line 182b connects to the write assist signal 152 through a M1-M0 via 198, and to a gate electrode 202 for the write assist device 150 through a M0-gate contact 199. Dummy line 184b connects to the write assist signal 162 through a M1-M0 via 200, and to a gate electrode 204 for the write assist device 160 through a M0-gate contact 201.

In operation, during a memory write operation where a "0" is being written to one or more memory cells, the write assist signal 152 is asserted. The write signal passes to the dummy line 182b through the via 198, and then passes to the gate 202 of the write assist device 150 through the contact 199. The values of the signal being passed to the gate 202 depends on various design choices, but for the sake of example, the gate 202 is for an NMOS transistor of the write assist device 150. In this example, the write assist signal 152 is a logical "1", thereby turning the write assist device "on". With the write assist device 150 "on", the source/drain 174 will be electrically connected to the source/drain 176 through a channel. As discussed above, source/drain 176 is connected to Vss ("0") through contact 196, and source/drain 174 is connected to the bit line BL through contact 194. As a result, the bit line BL will be driven to "0" at the dummy cell 128b. Simultaneously, since this is a memory write operation where a "0" is being written, the corresponding bit line driver 108 will also be driving a "0" on the bit line BL. (A "1" will be driven on the corresponding bit line BLB.) This means that a "0" is being driven at both opposing ends of the bit line BL, which effectively cuts the transmission line effects (e.g., inline resistance) in half.

During a memory write operation where a "1" is being written to one or more memory cells, the write assist signal 162 is asserted. The write signal passes to the dummy line 184b through the via 200, and then passes to the gate 204 of the write assist device 160 through the contact 201. The values of the signal being passed to the gate 204 depends on various design choices, but for the sake of example, the gate 204 is for an NMOS transistor of the write assist device 160. In this example, the write assist signal 162 is a logical "1", thereby turning the write assist device "on". With the write assist device 160 "on", the source/drain 172 will be electrically connected to the source/drain 170 through a channel. As discussed above, source/drain 170 is connected to Vss ("0") through contact 190, and source/drain 172 is connected to the bit line BLB through contact 192. As a result, the bit line BLB will be driven to "0" at the dummy cell 128b. Simultaneously, since this is a memory write operation where a "1" is being written, the corresponding bit line driver 108 will also be driving a "0" on the bit line BLB. (A "1" will be driven on the corresponding bit line BL.) This means that a "0" is being driven at both opposing ends of the bit line BLB, which effectively cuts the transmission line effects (e.g., inline resistance) in half.

In some embodiments, it is noted that the adverse transmission line effects of a bit line being driven to "0" or worse than when a bit line is being driven to "1". For these embodiments, only the "0" bit lines need be assisted. However, in other embodiments, another write assist driver can be included to assist in the bit line being driven to "1". Such driver can be implemented in a very straight-forward manner in light of the present disclosure. For example, the polarity of the write assist signals and/or transistors can be switched to accommodate driving a "1". In yet another embodiment, a single write assist driver can be used to accommodate driving both "0" and "1".

Figure 5:
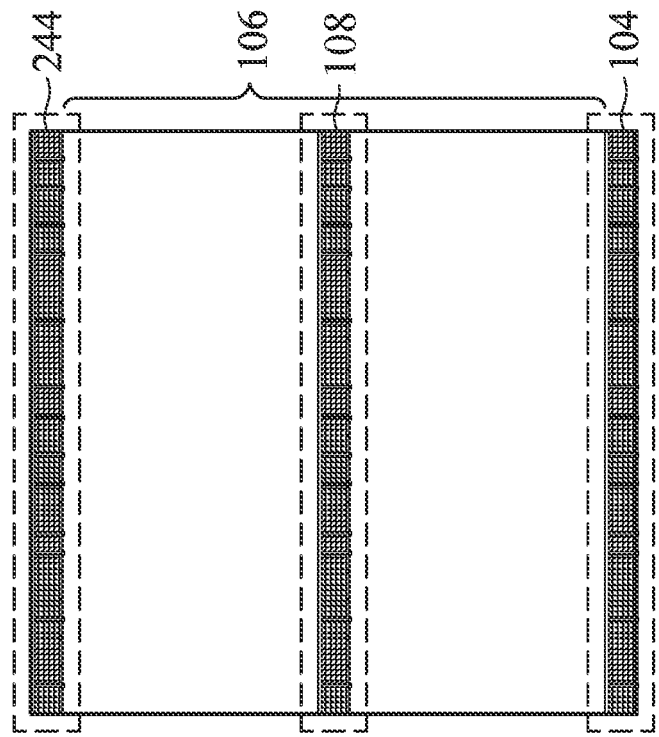
FIG. 5 shows a top view of a portion of the memory unit in FIG. 1, in accordance with another embodiment.

Referring now to FIG. 5, in another embodiment, the memory unit 102 is illustrated as a single block of memory, it being understood that there can be many more blocks, as desired. The memory unit 102 includes the first edge area 104 as shown on the bottom side of the figure, and a second edge area 244 as shown on the top side of the figure. In the present embodiment, the edge areas 104, 244 do not contain memory bits and are used for implementing well pick-up (WPU) structures. The WPU structures provides well pick-up structures for supplying voltages (or biasing) to the N wells and P wells in the memory unit 102. The memory unit 102 further includes the memory bit array 106 between the two WPU areas of the edge areas 104, 244. The memory bit array 106 contain the memory bits of the memory unit 102. The memory unit 102 further includes the area for the bit line drivers 108. The bit line driver area provides drivers for bit lines BL, BLB, a pair of each for each of the memory bits in the memory unit 102. Also in this embodiment, there are dummy rows at the edges of the memory bit array 106, adjacent to the edge areas 104, 244.

In operation, the embodiment of FIG. 5 performs similarly to the embodiment of FIGS. 1-4, except that the bit line drivers 108 in the bit line driver area can drive bit lines in either or both directions (left and right, as shown in the figure). This embodiment has the advantage in that the bit lines are already half as long as those in the first embodiments, given the same number of rows in each embodiment. Also in this embodiment, write assist drivers and corresponding circuitry can be provided in both of the dummy rows, to further assist in writing a "0" and/or "1" to the corresponding memory cell.

Several advantages are achieved by one or more of the above-described embodiments. First of all, an improved write speed is provided by the write assist circuit. This is because the bit line length from the bit line driver to the farthest row of memory cells is effectively cut in half, thereby reducing the transmission line effects of the bit line. In addition to improved write speed, an improved minimum power supply (Vccmin) for the memory bit array is provided. Secondly, these improvements can be had with little or no additional area required for peripheral circuitry. That is, by using the edge circuit with the dummy memory cells, the overall size of the embedded memory array is not increased.

In one embodiment, a semiconductor device including a memory unit is provided. The semiconductor device can be a memory device such as a static random-access memory (SRAM), or can be another device with embedded memory, such as an embedded SRAM. The memory unit includes a bit array arranged in rows and columns. The columns are defined by a plurality of bit line pairs connecting to a plurality of memory cells in the column. The memory unit also includes an edge area adjacent an edge row of the bit array, wherein the edge row includes a plurality of dummy memory cells. The memory unit further includes a plurality of bit line drivers adjacent the bit array and opposite the edge area. The bit line drivers are for driving the bit lines with data to the memory cells during a write operation. The dummy memory cells include a write assist circuit for each bit line pair. The write assist circuit is used for facilitating the writing of the data on the bit line pairs to the memory cells.

In some embodiments, the write assist circuit includes a transistor for selectively connecting one of the bit line in a bit line pair to a power supply during a write operation. The power supply can be a ground power supply.

In some embodiments, a write assist signal is connected to the write assist device, such that when a logic "0" is being written on a bit line, the write assist device connects the bit line to the ground power supply. Also, when a logic "1" is being written on a bit line, the write assist device does not connect the bit line to a power supply.

In another embodiment, a semiconductor device including a memory cell array is provided. The memory cell array includes a plurality of SRAM memory cells arranged into rows along a first direction and columns along a second direction different than the first direction. The memory device also includes a plurality of complementary bit line pairs connecting the memory cells in each column, and a plurality of word lines connecting the memory cells in each row. A plurality of bit line drivers are connected to the bit lines of the bit line pairs, the plurality of bit line drivers located adjacent a first row of the memory cell array. The memory cell array also includes a row of dummy cells, located a distance from the bit line drivers, such as at an opposite side of the memory cell array from the bit line drivers. Each dummy cell is modified from the remaining memory cells to include a write assist device connected to at least one bit line of each bit line pair. Each write assist device can be controlled by a write assist signal that is asserted during write operations.

In some embodiments, each write assist device includes a transistor with a gate electrode connected to the write assist signal. The transistor can include a source connected to a power supply, such as ground, and a drain connected to one of the bit lines of the bit line pairs.

In another embodiment, a SRAM semiconductor device is provided. The SRAM semiconductor device includes a substrate having a first region and a second region. The substrate includes a memory cell array in the first region including a plurality of memory cells arranged into rows along a first direction and columns along a second direction different than the first direction. The SRAM semiconductor device further includes a plurality of write assist circuits in the second region; and a plurality of conductive lines electrically coupling the memory cell array with the plurality of write assist circuits. Each of the plurality of conductive lines electrically couples a column of memory cells to a write assist circuit of the plurality of write assist circuits. The second region is a dummy region of the substrate remote from a source node and separated from the source node by the memory cell array.

In some embodiments, the plurality of conductive lines are each bit lines, and wherein each of the plurality of the write assist circuits is configured to set a voltage level of the corresponding bit line to be less than a ground reference level.

In one embodiment, a method for operating a semiconductor device including a memory unit is provided. The semiconductor device can be a memory device such as a static random-access memory (SRAM), or can be another device with embedded memory, such as an embedded SRAM. The memory unit includes a bit array arranged in rows and columns. The columns are defined by a plurality of bit line pairs connecting to a plurality of memory cells in the column. The memory unit also includes an edge area adjacent an edge row of the bit array, wherein the edge row includes a plurality of dummy memory cells. The memory unit further includes a plurality of bit line drivers adjacent the bit array and opposite the edge area. The bit line drivers are for driving the bit lines with data to the memory cells during a write operation. The dummy memory cells include a write assist circuit for each bit line pair. The method includes using the write assist circuit to drive write assist signals into the edge are. The write assist signals selectively activate write assist circuit in the dummy memory cells to facilitate writing of the data on the bit line pairs to the memory cells.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a memory unit, wherein the memory unit includes:
        a bit array arranged in rows and columns, where the columns are defined by a plurality of bit line pairs connecting to a plurality of memory cells in the column;
        an edge area adjacent an edge row of the bit array, wherein the edge row includes a plurality of dummy memory cells; and
        a plurality of bit line drivers adjacent the bit array and opposite the edge area,
    wherein the dummy memory cells include a write assist circuit for each bit line pair, each write assist circuit being connected in-line between a single bit line of each bit line pair and a power supply.

2. The semiconductor device of claim 1, wherein the memory cells are static random-access memory (SRAM) cells.

3. The semiconductor device of claim 1, wherein the write assist circuit includes a transistor for selectively connecting one of the bit line in a bit line pair to the power supply during a write operation.

4. The semiconductor device of claim 3, wherein the power supply is a ground power supply.

5. The semiconductor device of claim 4 further comprising a write assist signal connected to the write assist device, such that when a logic "0" is being written on a bit line, the write assist device connects the bit line to the ground power supply.

6. The semiconductor device of claim 5, such that when a logic "1" is being written on a bit line, the write assist device does not connect the bit line to the power supply.

7. The semiconductor device of claim 3, wherein the transistor includes a gate connected to a write assist signal driven externally of the bit array.

8. The semiconductor device of claim 7, wherein the transistor includes a first source/drain connected to the power supply, and a second source/drain connected to the one bit line.

9. A semiconductor device comprising:
a memory cell array including a plurality of Static Random Access Memory (SRAM) memory cells arranged into rows along a first direction and columns along a second direction different than the first direction;
a plurality of complementary bit line pairs connecting the memory cells in each column;
a plurality of word lines connecting the memory cells in each row;
a plurality of bit line drivers connected to the bit lines of the bit line pairs, the plurality of bit line drivers located adjacent a first row of the memory cell array; and
wherein, the memory cell array includes a row of dummy cells, located a distance from the bit line drivers,
wherein each dummy cell is modified from the remaining memory cells to include a write assist device connected to a bit line of each bit line pair, the write assist device being connected in-line between a single bit line and a power supply.

10. The semiconductor device of claim 9, wherein each write assist device is controlled by a write assist signal that is asserted during write operations.

11. The semiconductor device of claim 10, wherein each write assist device includes a transistor with a gate electrode connected to the write assist signal.

12. The semiconductor device of claim 11, wherein the transistor includes a source connected to the power supply, and a drain connected to one of the bit lines of the bit line pairs.

13. The semiconductor device of claim 12, wherein the power supply is a ground supply.

14. The semiconductor device of claim 11, further comprising an edge area adjacent the row of dummy cells.

15. The semiconductor device of claim 14, wherein the write assist signal is provided in a first metal layer, and is connected to the gate electrode through a metal-zero interconnect located in a well pickup area of the edge area.

16. The semiconductor device of claim 15, wherein the well pickup area is positioned between adjacent dummy memory cells.

17. A semiconductor device comprising:
a substrate having a first region and a second region;
a memory cell array in the first region including a plurality of memory cells arranged into rows along a first direction and columns along a second direction different than the first direction;
a plurality of write assist circuits in the second region; and
a plurality of conductive lines electrically coupling the memory cell array with the plurality of write assist circuits,
wherein each of the plurality of conductive lines electrically couples a column of memory cells to a write assist circuit of the plurality of write assist circuits,
wherein the second region is a dummy region of the substrate remote from a driver circuit for driving data on the conductive lines, and separated from the driver circuit by the memory cell array, and
wherein each write assist circuit of the plurality of write assist circuits is coupled in line to a single conductive line between the driver circuit and a power supply.

18. The semiconductor device of claim 17, wherein the plurality of conductive lines are each bit lines, and wherein each of the plurality of the write assist circuits is configured to set a voltage level of the corresponding bit line to be less than a ground reference level.

19. The semiconductor device of claim 17, wherein the second region is adjacent to a well-strap region.

20. The semiconductor device of claim 17, wherein the second region is an edge region of the substrate.

* * * * *